(12) United States Patent
Huang et al.

(10) Patent No.: US 8,787,434 B2
(45) Date of Patent: Jul. 22, 2014

(54) SAMPLING PHASE SELECTION METHOD FOR A STREAM OF DATA BITS

(71) Applicant: Raydium Semiconductor Corporation, Hsinchu (TW)

(72) Inventors: Ren-Feng Huang, Kaohsiung (TW); Hui Wen Miao, Hsinchu (TW); Ko-Yang Tso, Taipei County (TW); Chin-Chieh Chao, Hsinchu (TW)

(73) Assignee: Raydium Semiconductor Corporation, Hsinchu (TW)

( * ) Notice: Subject to any disclaimer, the term of this patent is extended or adjusted under 35 U.S.C. 154(b) by 105 days.

(21) Appl. No.: 13/645,917

(22) Filed: Oct. 5, 2012

(65) Prior Publication Data
US 2013/0094558 A1    Apr. 18, 2013

(30) Foreign Application Priority Data
Oct. 12, 2011 (TW) .............................. 100136876 A (51) Int. Cl.
*H04B 17/00* (2006.01)
*H04L 7/00* (2006.01)
*H04L 7/033* (2006.01)
*H04B 1/00* (2006.01)

(52) U.S. Cl.
CPC .............. *H03K 19/0815* (2013.01); *H04L 7/00* (2013.01); *H04L 7/0337* (2013.01); *H04B 1/00* (2013.01)

USPC ........... 375/224; 375/148; 375/222; 375/354; 375/355; 375/371; 714/700

(58) Field of Classification Search
USPC .................. 375/224, 148, 222, 354, 355, 371
See application file for complete search history.

(56) References Cited

U.S. PATENT DOCUMENTS

| 6,567,484 | B1 * | 5/2003 | Hirota et al. ................... 375/355 |
| 7,184,502 | B2 * | 2/2007 | Engl et al. ...................... 375/354 |
| 7,295,601 | B1 * | 11/2007 | Sinha et al. .................... 375/222 |
| 7,340,655 | B2 * | 3/2008 | Sugita ............................ 714/700 |
| 7,957,455 | B2 * | 6/2011 | Paul et al. ....................... 375/148 |
| 8,582,708 | B2 * | 11/2013 | Yamamoto et al. ........... 375/355 |
| 2009/0092214 | A1 * | 4/2009 | Bommareddy et al. ....... 375/371 |

* cited by examiner

*Primary Examiner* — Eva Puente (57) ABSTRACT

A sampling phase selection method for a data stream is provided, wherein the data stream has a variable data rate in a fixed time period. The method comprises generating a calibration signal, wherein the time interval of the calibration signal is longer than the fixed time period of the data stream, generating a first clock sequence and a subsequent second clock sequence, wherein the first and the second clock sequence are composed of a plurality of continuous clock phases and the number of the clock phases of the first clock sequence are the same as that of the clock phases of the second clock sequence, selecting one of the phases of the first and the second clock sequence, in turn, to provide a sampling phase, performing a plurality of samplings on the data stream to generate a flag signal, and selecting a final sampling phase according to the flag signals with different sampling phases.

9 Claims, 6 Drawing Sheets

SAMPLING PHASE SELECTION METHOD FOR A STREAM OF DATA BITS

BACKGROUND

1. Field of the Invention

The present invention relates to a sampling phase selection method for a data stream and, in particular, to a sampling phase selection method for a data stream having a variable data rate in a fixed time period.

2. Description of the Related Art

Most electronic devices may be driven by a clock signal during operation. With rapid developments in technology, a clock signal may operate at an operating frequency in the order of gigahertz (GHz) or higher. A clock signal may have a stable oscillating frequency, which is generated by an oscillator.

However, a desirable oscillator has a relatively high Q value, which is the allowed energy of the clock signal concentrated on a narrow baseband and the harmonic wave of the baseband. When the energy is concentrated on a high frequency harmonic wave, the radiation produced by Electro-Magnetic Interference (EMI) may be greater than regulation standards made by FCC, JEITA and IEC.

For reducing EMI, a Spread Spectrum (SS) is utilized to modulate the clock signal. The frequency of the SS modulated clock signal may not be fixed at a certain frequency but may be varied within a given frequency range. Therefore, the clock signal may have a lower energy distribution or lower frequency range to reduce the effect of EMI.

Figure 1A:
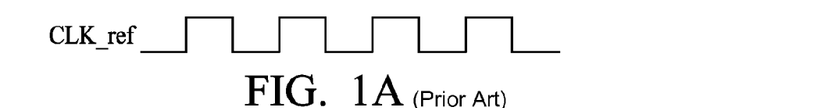
FIG. 1A shows a clock signal CLK_ref which is not modulated by SS.

FIG. 1A shows a clock signal CLK_ref which is not modulated by SS. As shown in FIG. 1A, the clock signal CLK_ref has a fixed frequency $f_c$.

Figure 1B:
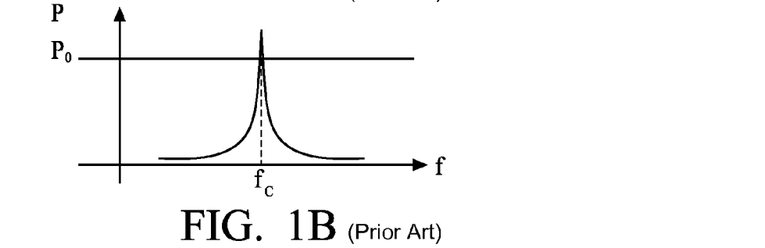
FIG. 1B shows a frequency spectrum of the clock signal CLK_ref.

FIG. 1B shows a frequency spectrum of the clock signal CLK_ref. As shown in FIG. 1B, the energy at frequency $f_c$ is above a given threshold energy $P_0$. The given threshold energy $P_0$ is the energy for causing EMI.

Figure 1C:
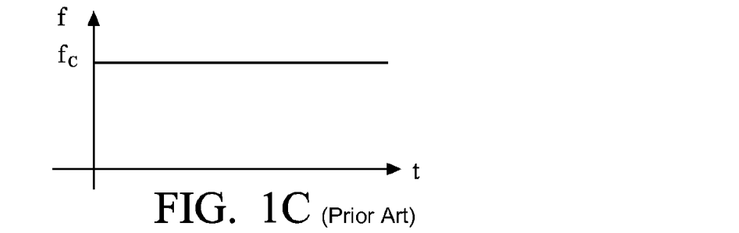
FIG. 1C is a diagram of the clock signal CLK_ref over time.

FIG. 1C is a diagram showing the clock signal CLK_ref over time.

Figure 2A:
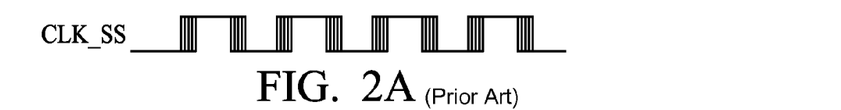
FIG. 2A shows a clock signal CLK_SS which is modulated by SS.

FIG. 2A shows a clock signal CLK_SS which is modulated by SS.

Figure 2B:
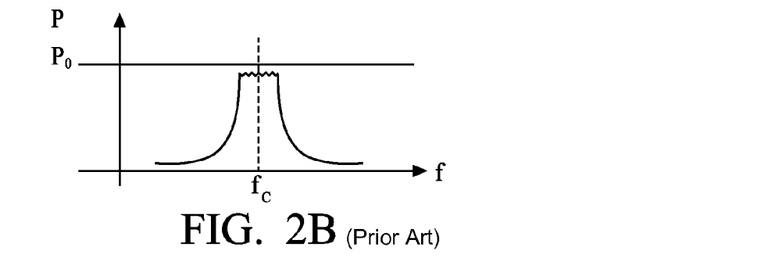
FIG. 2B shows a frequency spectrum of the clock signal CLK_SS.

FIG. 2B shows a frequency spectrum of the clock signal CLK_SS. As shown in FIG. 2B, the energy of the clock signal CLK_SS has been spread to frequency ranges $f_1$ and $f_2$. Therefore, energy at frequency $f_c$ is under a given threshold energy $P_0$.

Figure 2C:
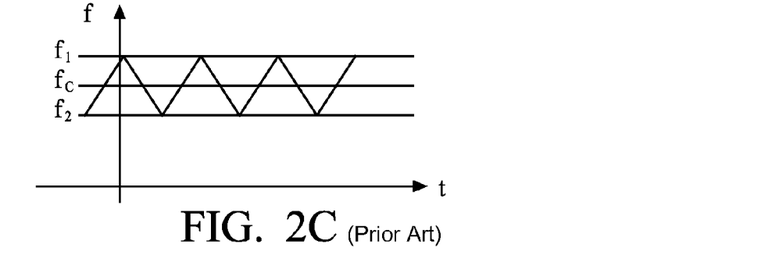
FIG. 2C is a diagram of the clock signal CLK_SS over time.

FIG. 2C is a diagram showing the clock signal CLK_SS over time. Referring to FIG. 2C, the output frequency of the clock signal CLK_SS may periodically work between a range of frequency f1 and f2.

Moreover, a high speed data stream may be modulated by SS and transmitted in order to reduce EMI. When the modulated data stream is transmitted, data jitter and phase skew between the modulated clock signal and the data stream may affect the sampling section of significant bits.

If a conventional oversampling is performed to sample bits of data of the modulated data stream, a certain sampling clock phase may only sample bits of data of a certain frequency band. Moreover, when a high-speed data stream is transmitted via a noise channel, the high-speed data stream may be interfered by a noise signal having a fixed time section.

If a conventional oversampling is performed on the high-speed data stream, the noise signal may be continuously sampled by a certain sample phase. Therefore, the current disclosure provides a method for selecting a sampling phase of a data stream.

SUMMARY

In accordance with one embodiment of the present invention, a sampling phase selection method for a data stream, wherein the data stream has a variable data rate in a fixed time period, comprises the steps of: generating a calibration signal, wherein a time interval of the calibration signal is longer than the fixed time period of the data stream; generating a first clock sequence and a subsequent second clock sequence, wherein the first and the second clock sequence are composed of a plurality continuous clock phases and the number of the clock phases of the first clock sequence are the same as that of clock phases of the second clock sequence; selecting one of the phases of the first and the second clock sequences, in turn, to provide a sampling phase; performing a plurality of samplings on the data stream to generate a flag signal; and selecting a final sampling phase according to the flag signals with different sampling phases.

In accordance with one embodiment of the present invention, the step of selecting one of the phases of the first and the second clock sequence, in turn, to provide a sampling phase comprises: selecting one of the continuous clock phases of the first sequence, in turn, to provide the sampling clock phase, and selecting one of the continuous clock phases of the second sequence, in turn, to provide the sampling clock phase, after a final clock phase of the first clock sequence is selected to provide the sampling clock phase.

In accordance with one embodiment of the present invention, the step of performing a plurality of samplings on the data stream to generate a flag signal comprises: determining whether a plurality of sampling results matches bit data of the data stream; generating a first counting signal, when one of the sampling results matches the bit data of the data stream; generating a second counting signal, when one of the sampling results does not match the bit data of the data stream; and generating the flag signal according to the first counting signal and the second counting signal.

In accordance with one embodiment of the present invention, the sampling phase selection method for a data stream may further comprise: generating a first accumulation value according to an accumulating counting number of the first counting signal; generating a first comparing signal, when the first accumulation value is over a first threshold; generating a second accumulation value according to an accumulating counting number of the second counting signal; generating a second comparing signal, when the second accumulation value is over a second threshold; and generating the flag signal according to the first and the second comparing signals.

In accordance with one embodiment of the present invention, the step of selecting a final sampling phase according to the flag signals with different sampling phases may comprise: selecting a first clock phase of the first clock sequence as the sampling clock phase for generating a first flag signal; selecting a clock phase of the second clock sequence as the sampling clock phase for generating a second flag signal, wherein the clock phase has no phase difference compared with that of the first clock sequence; performing a logic operation with the first flag signal and the second flag signal for generating a third flag signal; and selecting the final sampling clock phase from the clock phases according to the third flag signal.

In accordance with one embodiment of the present invention, the logic calculation comprises an AND operation.

In accordance with one embodiment of the present invention, the sampling phase selection method further comprises: generating at least one third clock sequence during the time interval of the calibration signal, wherein the at least one third clock sequence is a subsequent clock phase to the second clock sequence, wherein the at least one third clock sequence and the first clock sequence are composed of a plurality of continuous clock phases and the number of the clock phases of the at least one third clock sequence are the same as that of the clock phases of the first clock sequence; and selecting one clock phase from the clock phases of the first clock sequence, the second clock sequence and the at least one third clock sequence, in turn, as a sampling clock phase.

In accordance with one embodiment of the present invention, the data stream comprises a periodic spread spectrum data stream.

In accordance with one embodiment of the present invention, the data stream is transmitted under a point-to-point mini-LVDS communication protocol.

In order to provide further understanding of the techniques, means, and effects of the current disclosure, the following detailed description and drawings are hereby presented, such that the purposes, features and aspects of the current disclosure may be thoroughly and concretely appreciated; however, the drawings are provided solely for reference and illustration, without any intention to be used for limiting the current disclosure.

BRIEF DESCRIPTION OF THE DRAWINGS

The objectives and advantages of the present invention are illustrated with the following description and upon reference to the accompanying drawings in which.

DETAILED DESCRIPTION OF THE INVENTION

The present invention discloses a sampling phase selection method for a data stream, wherein the data stream has a variable data rate in a fixed time period.

Figure 3:
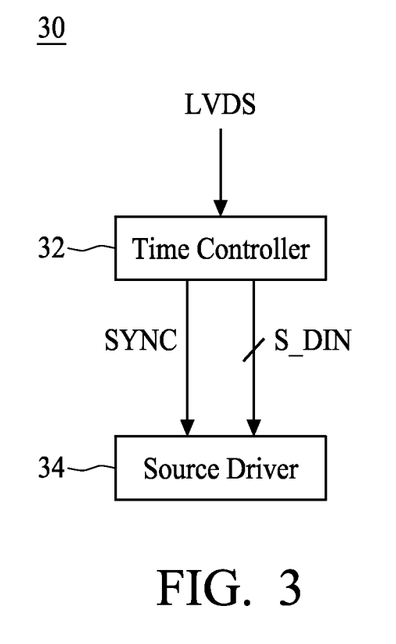
FIG. 3 shows a driving system 30 of a flat-screen display utilizing a method for selecting a sampling phase of a data stream of one embodiment of the current invention.

FIG. 3 is a schematic view of one embodiment of the present invention showing a driving system 30 of a flat screen display utilizing the method for a data stream. The driving system 30 includes a time controller 32 and a source driver 34, wherein the time controller 34 is configured to receive a low-voltage differential signaling (LVDS) and generate a data stream S_DIN. The data stream S_DIN may include frame data, which may be necessary to a display panel. The data stream S_DIN may be transmitted to the source driver 34 via a data transmission interface.

In one embodiment of the present invention, the data stream may be transmitted under a point-to-point mini-LVDS communication protocol. In order to conform to regulations of EMI, the data stream may be expressed as a periodic spread spectrum data stream. Furthermore, a calibration signal SYNC may be transmitted to the source driver 34 from the time controller 32. During calibration, a desirable sampling clock phase for sampling the data stream S_DIN would be selected, from a plurality of clock phases, by the source driver 34.

Figure 4:
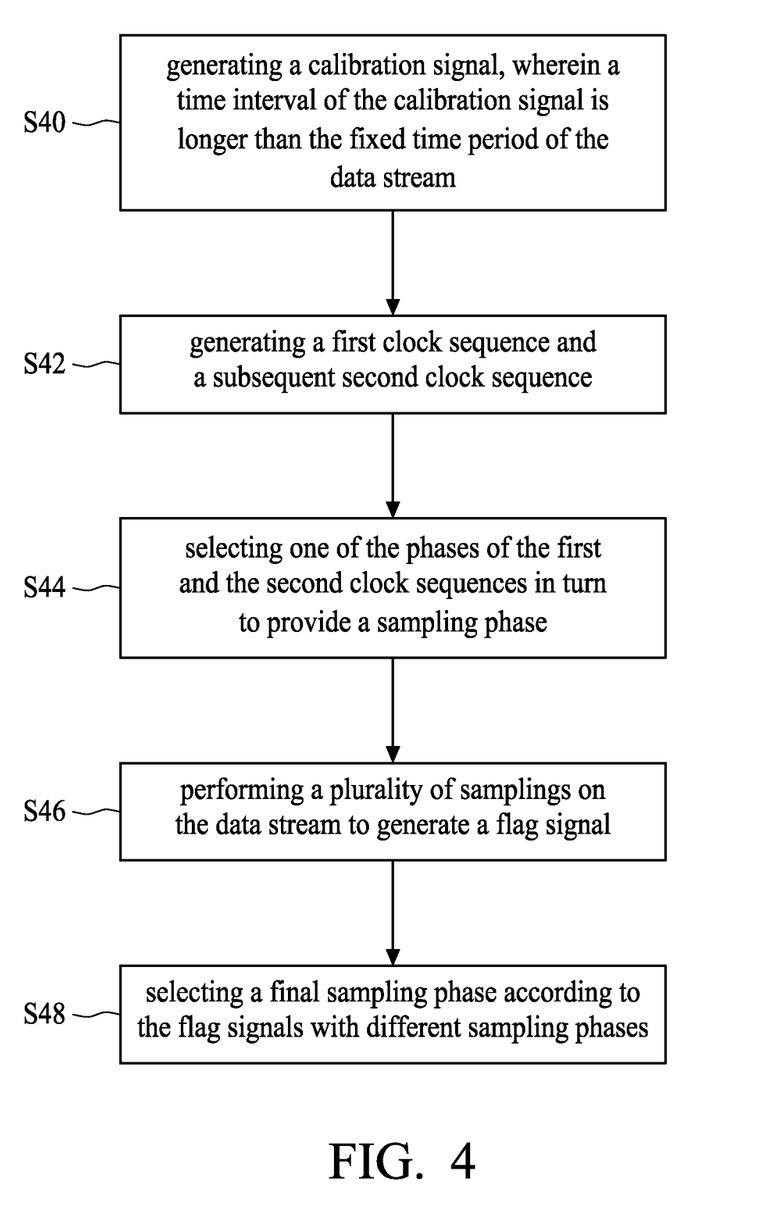
FIG. 4 is a flow chart of the sampling clock phase selection method for a data stream of one embodiment of the current invention.

FIG. 4 is a flow chart of the sampling clock phase selection method for a data stream of one embodiment of the current invention, wherein the data stream has a variable data rate in a fixed time period. As shown in FIG. 4, in Step S40, a calibration signal may be generated, wherein a time interval of the calibration signal is longer than the fixed time period of the data stream.

Next, in Step S42, a first clock sequence seq1 and a subsequent second clock sequence seq2 may be generated, wherein the first and the second clock sequences are each composed of a plurality of continuous clock phases and the number of the clock phases of the first clock sequence seq1 is the same as that of the clock phases of the second clock sequence seq2.

In Step S44, one of the phases of the first and the second clock sequences may be selected, in turn, to provide a sampling phase.

Next, in Step S46, a plurality of samplings on the data stream may be performed to generate a flag signal.

Figure 5:
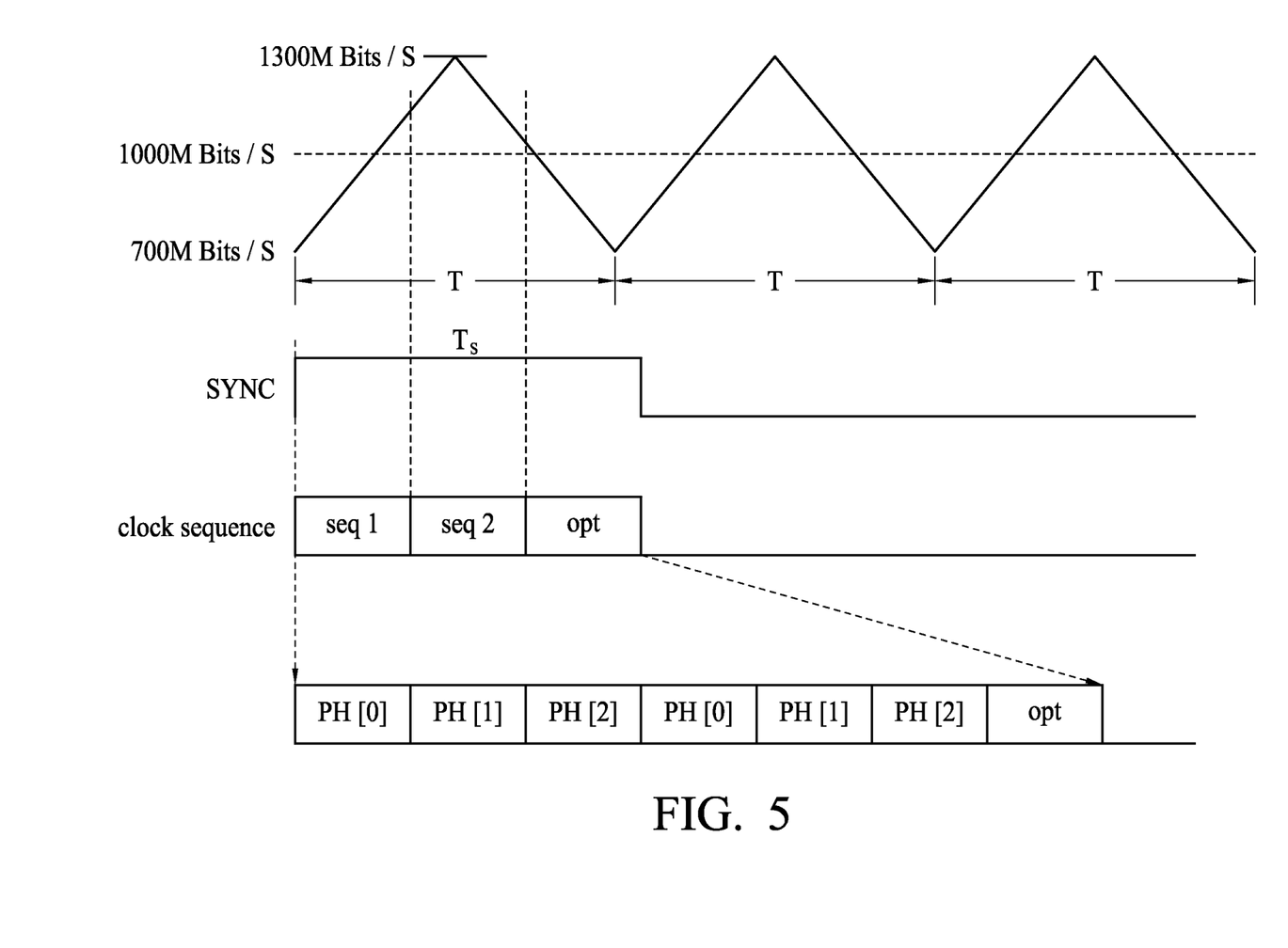
FIG. 5 is a sequence diagram of the sampling phase selection method.
Figure 7:
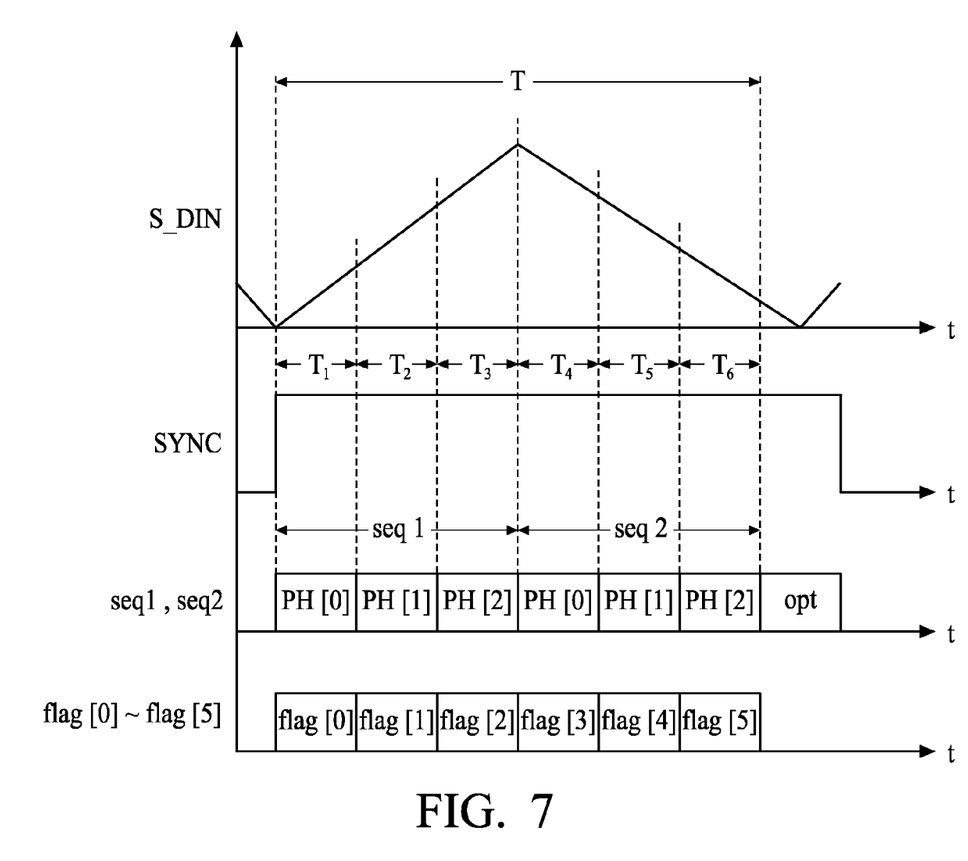
FIG. 7 is a sequence diagram of performing sampling on the data stream S_DIN by different sampling phases.

Subsequently, in Step S48, a final sampling phase may be selected according to the flag signals with different sampling phases. FIG. 3, FIG. 5 and FIG. 7 illustrate the embodiment in detail.

FIG. 5 is a sequence diagram of the sampling phase selection method. Referring to FIG. 5, during a fixed time period, a data rate of the data stream S_DIN may vary in a range of 700M Bits/s to 1300M Bits/s, which means that 1000M Bits/s would be the middle point of the range. In other words, the data stream S_DIN may have a variable data rate in a fixed time period. Since a time interval $T_s$ of the calibration signal SYNC may be longer than the fixed time period T of the data stream S_DIN, the sampling phase selection method for a data stream of the current invention may be performed, during the time interval $T_s$ of the calibration signal, to obtain a desirable or the best sampling clock phase.

Furthermore, during the time interval $T_s$ of the calibration signal, each of a plurality of clock phases of the first sequence seq1 and the second sequence seq2 may be generated at a rising edge of the calibration signal SYNC. Moreover, each of the sequences may include continuous clock phases, that is, a first clock phase PH[0], a second clock phase PH[1] and a third clock phase PH[2].

Figure 6:
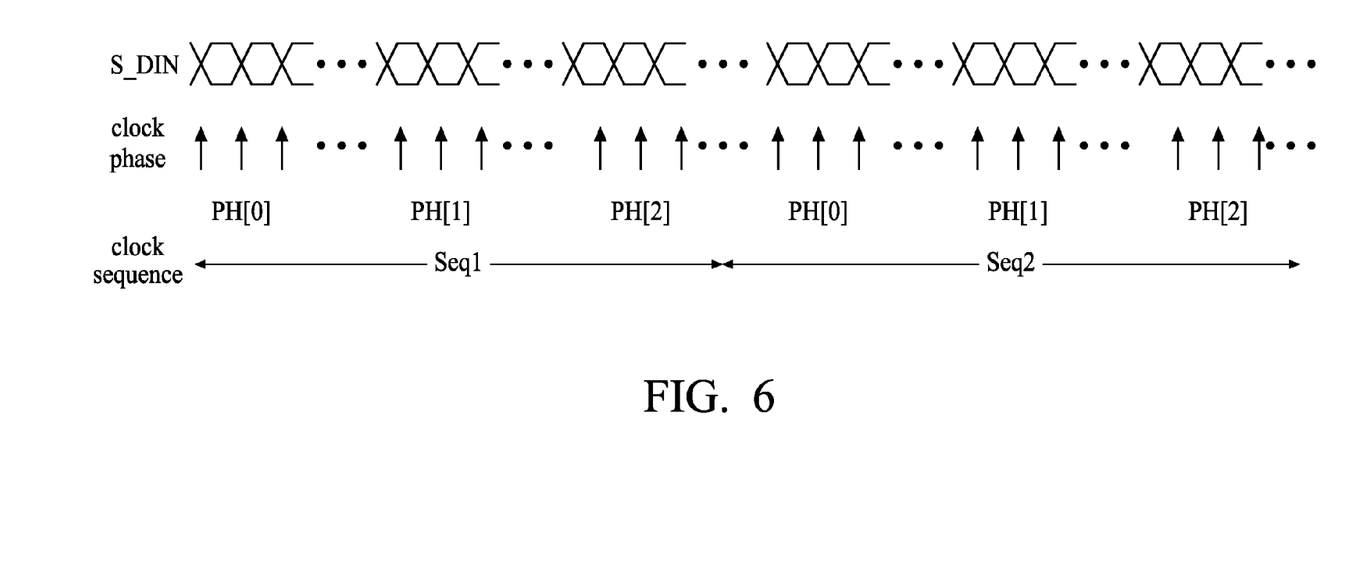
FIG. 6 is a sequence diagram of the clock sequences, the first clock sequence seq1 and the second clock sequence seq2.

FIG. 6 is a sequence diagram of the clock sequences, the first clock sequence seq1 and the second clock sequence seq2. Referring to FIG. 6, the second clock sequence seq2 is right after the first clock sequence seq1. Furthermore, compared with a rising edge of the first clock sequence seq1 and that of the second clock sequence seq2, the first clock phase PH[0] of the first clock sequence seq1 and the first clock phase PH[0] of the second clock sequence seq2 may not have phase differences.

The same conditions apply where the second clock phase PH[1] of the first clock sequence seq1 and the second clock phase PH[1] of the second clock sequence seq2 have a same phase difference, or the third clock phase PH[2] of the first clock sequence seq1 and the third clock phase PH[2] of the second clock sequence seq2 have a same phase difference. For the purpose of convenience and brevity, the first clock sequence seq1, the second clock sequence seq2, and three clock phases, PH[0], PH[1] and PH[2], are illustrated as an example in the present embodiment. In other embodiments according to the present invention, other number of clock sequences and other number of clock phases may be employed.

For example, for obtaining bit data transmitted at different data rates, during each of the fixed time periods T, of the data stream S_DIN, more than three clock sequences may be established during the time interval $T_s$ of the calibration signal SYNC for increasing the number of samplings.

Referring back to FIG. 5, after a plurality of first clock sequences seq1 and second clock sequences seq2 are generated, one of the phases of the first and the second clock sequences, seq1 and seq2, may be selected, in turn, to provide a sampling phase, and a plurality of samplings may be performed on the data stream by the sampling phase.

FIG. 7 is a sequence diagram of performing sampling on the data stream S_DIN by different sampling phases. Referring to FIG. 7, during a time interval $T_1$, the clock phase PH[0] of the clock sequence seq1 would first be selected as a sampling clock phase. Therefore, a plurality of first sampling results may be generated during the time interval $T_1$. A value of first flag signal flag[0] would be setup according to a matching result of the bits of data of the data stream and the first sampling results.

In one embodiment of the present invention, a first counting signal would be generated when the first sampling results match the bits of data of the data stream. Then, a first accumulation value would be generated according to an accumulating counting number of the first counting signal. Next, a logic level of the first flag signal flag[0] would be setup as 1 when the first accumulation value is over a first threshold, for example, 16.

On the contrary, a second counting signal would be generated when the first sampling results do not match the bits of data of the data stream. Then, a second accumulation value would be generated according to an accumulating counting number of the second counting signal. Next, a logic level of the first flag signal flag[0] would be setup as 0 when the second accumulation value is over a second threshold, for example, 5.

Moreover, during a time interval $T_2$, the clock phase PH[1] may be selected as a sampling clock phase, subsequently. Therefore, a plurality of second results may be generated. A second flag signal flag[1] may be setup according to a matching result of the bits of data of the data stream S_DIN and the second sampling results. Moreover, a third flag signal flag[2], a fourth flag signal flag[3], a fifth flag signal flag[4] and a sixth flag signal flag[5] may be setup subsequently.

Moreover, in the sampling phase selection method of the present invention, the clock phase PH[0] may be selected as a sampling clock phase during the fixed period T of the data stream S_DIN when the data stream S_DIN may be transmitted within a range of a lower data rate (e.g., 700M Bits/s to 900M Bits/s) and within a range of a higher data rate (e.g., 1100M Bits/s to 1300M Bits/s). Meanwhile, the flag signals, flag[0] and flag[3], may be setup according to the sampling clock phase.

Since the clock phase PH[0] may be selected as a sampling clock phase in different ranges of data rates, in order to obtain the sampling results of the different ranges of data rates, integrity and reliability of the sampling results may be significantly improved at selecting the best sampling clock phase.

In this embodiment, when the clock phase PH[0] is selected as a sampling clock phase, the flag signals, flag[0] and flag[3], may be generated. When the clock phase PH[1] is selected as a sampling clock phase, the flag signals, flag[1] and flag[4], may be generated. When the clock phase PH[2] is selected as a sampling clock phase, the flag signals, flag[2] and flag[5], may be generated. For selecting the final sampling clock phase from the clock phases of PH[0], PH[1] and PH[2], a logic operation may be performed, after a time interval $T_6$, on two results of the flag signals, flag[0] and flag[3]. Meanwhile, a logic operation may be performed on two results of the flag signals, flag[1] and flag[4], and a logic operation may be performed on two results of the flag signals, flag[2] and flag[5].

For example, assuming the values of the flag signals, flag[0], flag[1], flag[2], flag[3], flag[4], and flag[5], are 1, 1, 0, 1, 1, and 1, respectively, an AND operation is performed on the values of the flag signals, flag[0] and flag[3], to obtain a logic value "1", and on the values of the flag signals, flag[2] and flag[5], to obtain a logic value "0". Therefore, the final sampling clock phase may be selected from the clock phases PH[0] and PH[1]. As shown in FIG. 7, the logic operations may be performed within an interval "opt".

Moreover, a specific algorithm may be utilized for selecting a final sampling clock phase from the flag values of the clock phases, PH[0] and PH[1]. One embodiment of the specific algorithm is illustrated in a patent application, entitled "SAMPLING PHASE SELECTION MODULE FOR A STREAM OF DATA BITS," under Application NO. 100113490, filed Apr. 19, 2011 in Taiwan. However, the present invention is not limited to such algorithm.

Although the present invention and its objectives have been described in detail, it should be understood that various changes, substitutions and alterations can be made herein without departing from the spirit and scope of the invention as defined by the appended claims. For example, many of the processes discussed above can be implemented using different methodologies, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A sampling phase selection method for a data stream, wherein the data stream has a variable data rate in a fixed time period, the method comprising:

generating a calibration signal, wherein a time interval of the calibration signal is longer than the fixed time period of the data stream;

generating a first clock sequence and a second clock sequence at a rising edge of the calibration signal, wherein the first clock sequence and the second clock sequence are composed of a plurality of continuous clock phases and a number of the clock phases of the first clock sequence are the same as that of the clock phases of the second clock sequence;

selecting one of the clock phases of the first and the second clock sequences, in turn, to provide a sampling phase;

performing a plurality of samplings on the data stream in accordance with the sampling phase to generate a flag signal; and selecting a final sampling clock phase according to the flag signal with different sampling phases.

2. The sampling phase selection method of claim 1, wherein the step of selecting one of the clock phases of the first and the second clock sequence to provide a sampling phase comprises:

selecting one of the continuous clock phases of the first clock sequence to provide the sampling phase; and selecting one of the continuous clock phases of the second clock sequence to provide the sampling phase after a final sampling clock phase of the first clock sequence is selected to provide the sampling phase.

3. The sampling phase selection method of claim 1, wherein the step of performing a plurality of samplings on the data stream to generate a flag signal comprises:

determining whether a plurality of sampling results matches bits of data of the data stream;

generating a first counting signal when one of the sampling results matches the bits of data of the data stream;

generating a second counting signal when one of the sampling results does not match the bits of data of the data stream; and generating the flag signal according to the first counting signal and the second counting signal.

4. The sampling phase selection method of claim 3 further comprising:

generating a first accumulation value according to an accumulating counting number of the first counting signal;

generating a first comparing signal when the first accumulation value is over a first threshold;

generating a second accumulation value according to an accumulating counting number of the second counting signal;

generating a second comparing signal when the second accumulation value is over a second threshold; and generating the flag signal according to the first and the second comparing signals.

5. The sampling phase selection method of claim 1, wherein the step of selecting a final sampling clock phase according to the flag signal with different sampling phases comprises:

selecting a first clock phase of the first clock sequence as the sampling clock phase for generating a first flag signal;

selecting a clock phase of the second clock sequence as the sampling clock phase for generating a second flag signal, wherein the clock phase has no phase difference compared with that of the first clock sequence;

performing a logic operation with the first flag signal and the second flag signal for generating a third flag signal; and selecting the final sampling clock phase from the clock phases according to the third flag signal.

6. The sampling phase selection method of claim 5, wherein the logic operation comprises an AND operation.

7. The sampling phase selection method of claim 1 further comprising:

generating at least one third clock sequence during the time interval of the calibration signal, wherein the at least one third clock sequence is a subsequent clock phase to one of the plurality of continuous clock phase, wherein the at least one third clock sequence and the first clock sequence are composed of a plurality of continuous clock phases and the number of the clock phases of the at least one third clock sequence are the same as that of the clock phases of the first clock sequence; and selecting one clock phase from the clock phases of the first clock sequence, the second clock sequence and the at least one third clock sequence as a sampling clock phase.

8. The sampling phase selection method of claim 1, wherein the data stream comprises a periodic spread spectrum data stream.

9. The sampling phase selection method of claim 1, wherein the data stream is transmitted under a point-to-point mini-LVDS communication protocol.

* * * * *